US007091801B2

(12) United States Patent
Schmidt et al.

(10) Patent No.: US 7,091,801 B2
(45) Date of Patent: Aug. 15, 2006

(54) MICROMECHANICAL RESONATOR HAVING A METAL LAYER SURROUNDING A CYLINDER FORMED IN A BASE LAYER

(75) Inventors: Ewald Schmidt, Ludwigsburg (DE); Juergen Hasch, Stuttgart (DE); Heinz Pfizenmaier, Murrhardt (DE)

(73) Assignee: Robert Bosch GmbH, Stuttgart (DE)

( * ) Notice: Subject to any disclaimer, the term of this patent is extended or adjusted under 35 U.S.C. 154(b) by 148 days.

(21) Appl. No.: 10/416,782

(22) PCT Filed: Aug. 16, 2002

(86) PCT No.: PCT/DE02/03003
§ 371 (c)(1),
(2), (4) Date: May 15, 2003

(87) PCT Pub. No.: WO03/041215
PCT Pub. Date: May 15, 2003

(65) Prior Publication Data

US 2004/0031999 A1 Feb. 19, 2004

(30) Foreign Application Priority Data

Nov. 9, 2001 (DE) ................................ 101 56 257

(51) Int. Cl.
*H03H 9/24* (2006.01)
*H01P 7/00* (2006.01)

(52) U.S. Cl. .................. 333/186; 333/219; 333/219.1; 257/252

(58) Field of Classification Search ........ 333/186–192, 333/199, 202, 219.1, 230, 219; 257/252, 257/414
See application file for complete search history.

(56) References Cited

U.S. PATENT DOCUMENTS

| | | | | |
|---|---|---|---|---|
| 4,211,987 | A * | 7/1980 | Pan | 333/230 |
| 5,424,698 | A * | 6/1995 | Dydyk et al. | 333/219.2 |
| 5,821,836 | A | 10/1998 | Katehi et al. | 333/202 |
| 6,665,476 | B1 * | 12/2003 | Braun et al. | 385/50 |
| 6,909,163 | B1 * | 6/2005 | Pfizenmaier et al. | 257/499 |
| 2003/0015729 | A1 * | 1/2003 | Bosco et al. | 257/190 |
| 2005/0001632 | A1 * | 1/2005 | Schmidt et al. | 324/644 |

FOREIGN PATENT DOCUMENTS

| | | |
|---|---|---|
| EP | 0 678 905 | 10/1995 |
| WO | 98/57423 | 12/1998 |
| WO | 01 84665 A | 11/2001 |

OTHER PUBLICATIONS

Kim C et al: " Amicromachined Cavity Resonator for . . . " Sensors and Actuators A, Elsevier Sequoia S.A., Lausanne, CH, BD. 83, NR. 1-3, May 2000, pp. 1-5.

* cited by examiner

*Primary Examiner*—Barbara Summons
(74) *Attorney, Agent, or Firm*—Michael J. Striker

(57) ABSTRACT

The invention relates to a micromechanical resonator having a bondable resonance body and a method for fabricating a micromechanical resonator for semiconductor components.

The invention provides that the resonator (26) is composed successively of a first layer (16) of silicon for coupling the resonator (26) in terms of a circuit, an insulating layer (14) of silicon dioxide, a cylindrical base layer (cylinder 18), and a metal layer (20) completely surrounding the cylinder (18).

The method provides that a cylindrical structure (18) (cylinder) is etched (trench etching process) in a base layer (12) of $p^-$-doped silicon (SOI wafer) separated from a layer (16) of silicon by an insulating layer (14), and the cylindrical structure (18) is coated with a metal layer (20).

17 Claims, 4 Drawing Sheets

MICROMECHANICAL RESONATOR HAVING A METAL LAYER SURROUNDING A CYLINDER FORMED IN A BASE LAYER

BACKGROUND OF THE INVENTION

The invention relates to a micromechanical resonator.

PRIOR ART

Semiconductor technology is being used to an ever-increasing extent in automotive engineering. Miniaturization not only allows improvement of closed-loop and open-loop control of engine-specific functions, it also opens the way for new safety systems, such as parking aids, pre-crash and side-crash functions, and distance measurement. Sensors—that have been miniaturized, if possible—must be provided in the motor vehicle for all processes based on closed-loop and open-loop control technology.

Contactless sensors are frequently used that emit a measuring beam having a certain frequency that reflects on the object to be measured and is detected once more and evaluated by means of a receiver unit. In semiconductor technology, the use of "dielectric resonators" is known to stabilize the frequency of microwave oscillators or in a combination of a plurality of dielectric resonators in microwave filters up to a frequency of approximately 40 GHz. The microwave oscillators are constructed using hybrid technology, according to which a "dielectric resonator pill" is mounted on a conductor substrate in a suitable location. The resonator pill is secured via coupling leads to the surrounding microstrip line circuits of the conductor substrate. Merely installing the resonator pill on the conductor substrate in an exact position is technically complex and, therefore, expensive, and it can result in a small yield rate. After installation, it is also necessary to adjust the dielectric resonators using a punch located spacially above them in order to obtain the closely toleranced setpoint resonance frequency. Due to the fact that the geometry becomes increasingly smaller as the frequency increases—and due to the problems that then occur during adjustment—dielectric resonator oscillators cannot be fabricated according to the current state of the art for frequencies above 40 GHz.

SUMMARY OF THE INVENTION

In contrast, the resonator according to the invention offers the advantage that precise dielectric resonator oscillators can also be obtained for frequencies above 40 GHz. The micromechanical high-frequency resonator according to the invention is composed successively of (a) a first layer of silicon that serves to couple the resonator in terms of a circuit, (b) an insulating layer of silicon dioxide, (c) a cylindrical base layer (second layer) of $p^-$-doped silicon, and (d) a metal layer completely surrounding the cylindrical base layer.

Instead of the dielectric resonator pill, which must be installed on the carrier substrate and adjusted precisely, the present resonator is therefore already an integral part of a semiconductor component.

The production method according to the invention provides that cylindrical structural elements (cylinders) are etched (trench etching process) in a base (second) layer of $p^-$-doped silicon (SOI wafer) separated from a first layer of silicon via an insulating layer, which said cylindrical structural elements are then completely metallized. The positioning of the resonator on the semiconductor component, in particular to a microstrip line circuit, is ensured by the high accuracy of photolithographic methods. The very high precision involved in trench etching of the resonator cylinder ensures a closely toleranced setpoint resonance frequency, so that frequency tuning is no longer required.

A preferred embodiment of the resonator provides that the metal layer on the cylindrical base layer is formed by an aluminum layer. Said aluminum layer can be deposited in simple fashion using process engineering. It is further preferred if the metal layer is provided with another metal layer, in particular a nickel layer. This allows the resonator or an oscillator circuit (chip) comprising the resonator to be soldered in a housing or the like in simple fashion.

It has proven further advantageous to fabricate micromechanical high-frequency resonators with a radius of 600 to 1000 μm, in particular 750 to 850 μm, and with a resonator height of 550 to 900 μm, in particular 700 to 750 μm, using a photolithographic method. Cylinders metallized in this fashion can be excited specifically in the $TM_{010}$ mode, and they cover resonance frequencies in the high GHz range. The metallization prevents the high-frequency field from escaping from the resonator.

BRIEF DESCRIPTION OF THE DRAWINGS

The invention is explained in greater detail hereinbelow in an exemplary embodiment with reference to associated drawings.

DETAILED OF THE PREFERRED EMBODIMENTS

Figure 1:
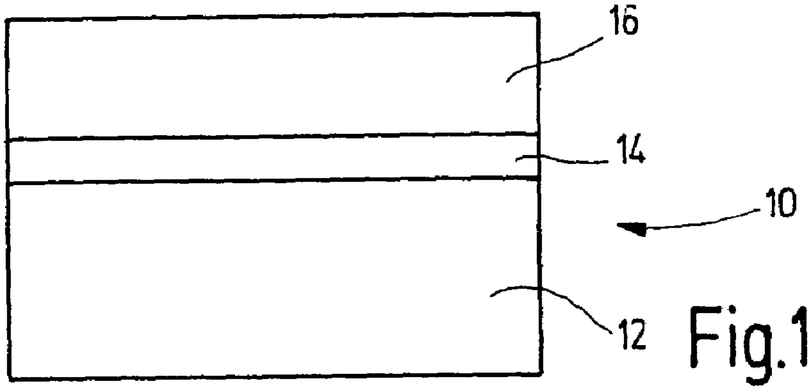
FIG. 1 through 3 is a schematic cross-section through an SOI wafer for micromechanical structures in the region of the resonator in various stages of fabrication.

In a schematic cross-section, FIG. 1 shows a section of a commercially available SOI (Silicon-on-Insulator) wafer 10 that can be used to produce the micromechanical structures according to the invention. The wafer is composed of a 675 μm-thick, semi-insulating, $p^-$-doped base layer 12 of silicon. It has a specific resistance in the range of 500 to 1000 Ωcm, in particular 750 Ωcm. The base layer 12 is covered by an approximately 300 nm-thick insulating layer 14 of silicon dioxide, on which a 50 μm-thick $p^-$-doped layer 16 of silicon is applied.

Figure 2:
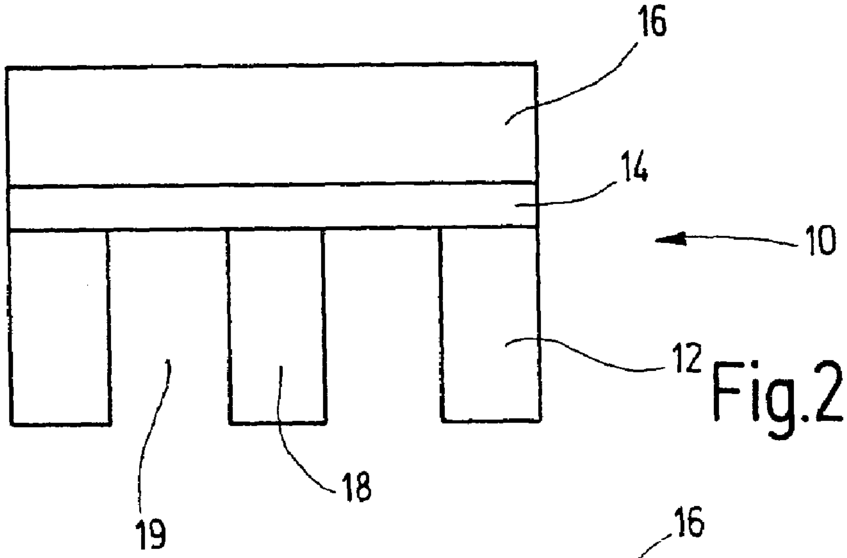

The insulating layer 14 of silicon dioxide serves as etching stop in the trench etching of micromechanical structures in the base layer 12. Known methods that will not be explained in greater detail here can be used for this purpose. The trench etching process exposes a membrane composed of the precise 50 μm-thick layer 16 and the 300 nm-thick insulating layer 14 that stretches across an open space 19. Masking steps carried out during trench etching result in a cylinder 18 being formed in the layer 12 in the open space 19 (FIG. 2). Said cylinder is more or less surrounded by the open space 19.

Figure 3:
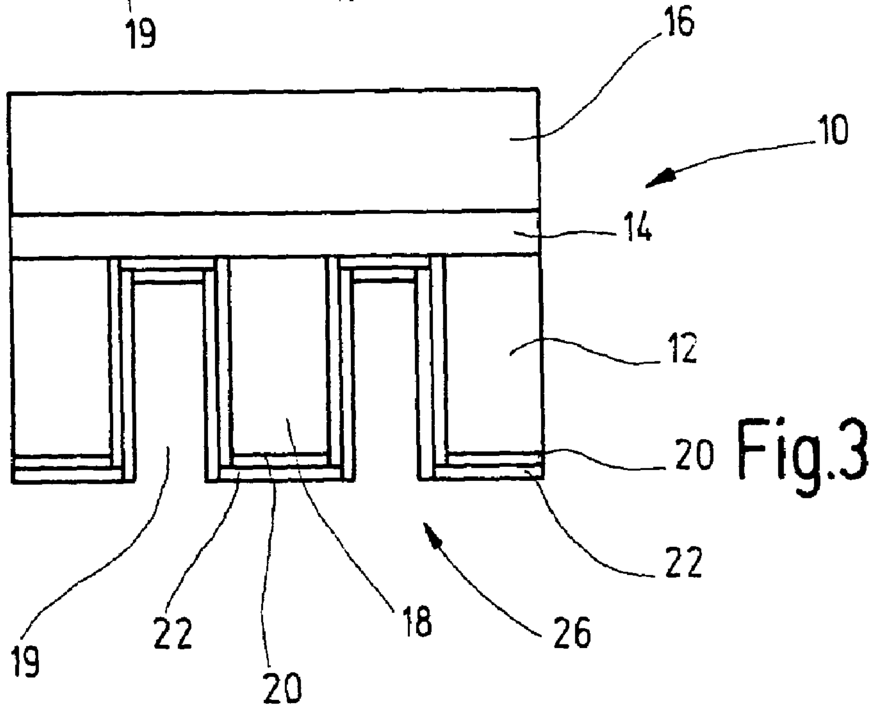

The cylindrical structure 18 that results is coated by vapor-depositing or sputtering with an aluminum layer 20 that is approximately 1 μm thick (FIG. 3). The cylinder 19, now metallized, serves as microwave resonator 26 with high factor of quality (Q≈200) filled with semi-insulated silicon, which can be excited specifically in the $TM_{010}$ mode. An additional copper layer in the region of the resonator 26 required according to conventional technology to dissipate heat can be eliminated.

If necessary, a further metal layer, in particular a nickel layer 22, can be applied, which can serve as solder base for the eventual soldering of a chip comprising the resonator into a housing or the like.

Figure 4:
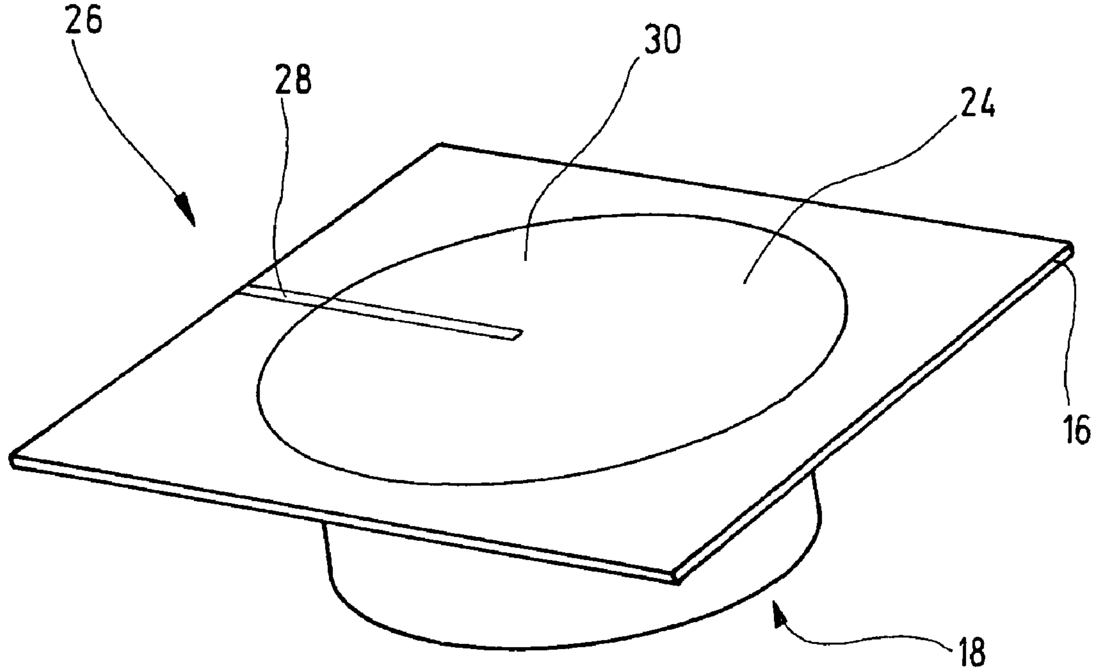
FIG. 4 is a schematic top view of a micromechanical resonator.

A region of the layer 16 above the cylinder 18 is vapor-deposited with a coupling disk 24 that extends over the cylinder resonator lying under it (FIG. 4). The coupling disk 24 is sized to prevent microwave energy from escaping at its edge. A diameter of the coupling disk 24 is selected that is greater, in particular, than a diameter of the cylinder 18. A recess 30, designed preferably as a slit, is patterned in the coupling disk 24 to accommodate a microwave guide 28. The resonator 26 has a height of approximately 725 μm, a radius of approximately 800 μm, and is suitable for resonance frequencies in the range of 40 GHz.

Figure 5B:
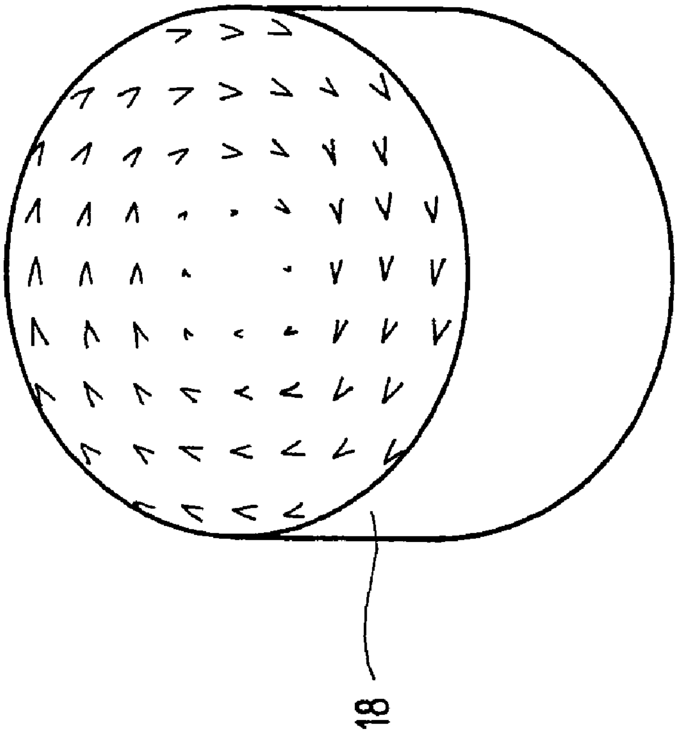
FIG. 5 is the course of the electrical and magnetic lines of force in the $TM_{010}$ mode.
Figure 5A:
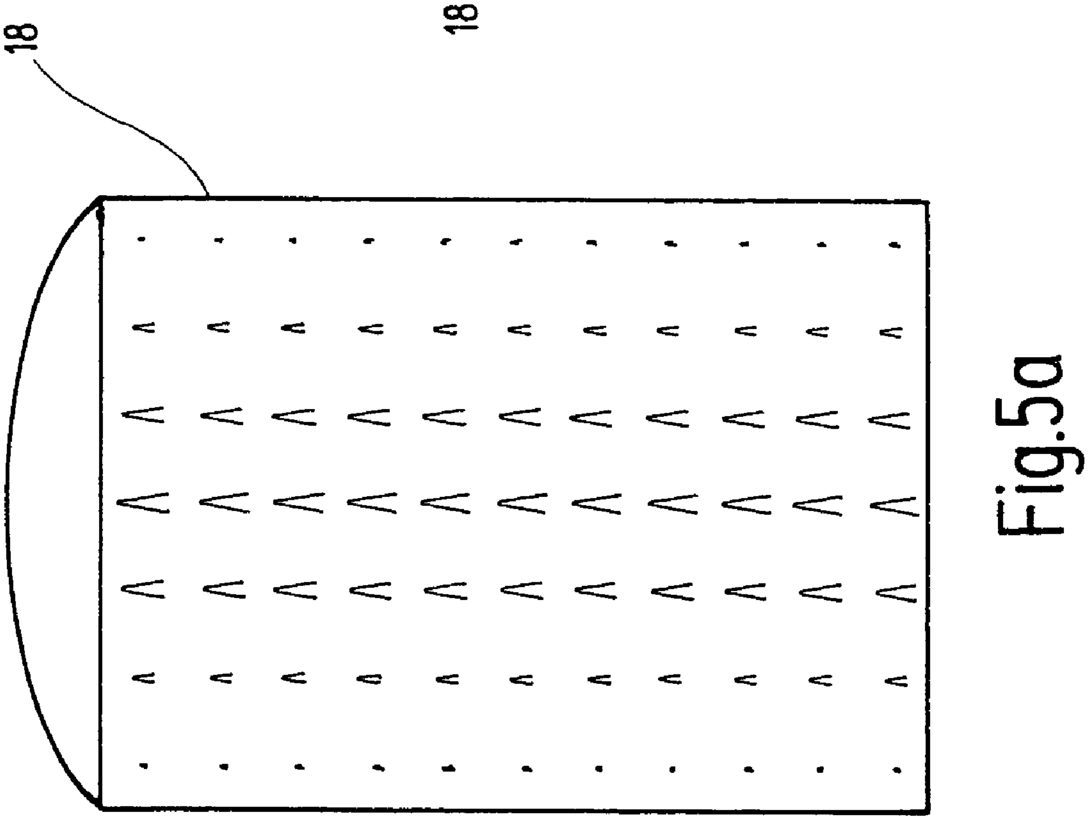

FIGS. 5*a* and 5*b* show a course of the electrical lines of force (FIG. 5*a*) and the magnetic lines of force (FIG. 5*b*) during excitation in the $TM_{010}$ mode. FIGS. 5*a* and 5*b* both show the cylinder 18, as a sectional drawing and in a top view, respectively. The advantage of the excitation described is the fact that the resonance frequency does not depend on the height of the resonator 26, since a thickness tolerance of the base layer 12 has no influence on the oscillation frequency.

Figure 6:
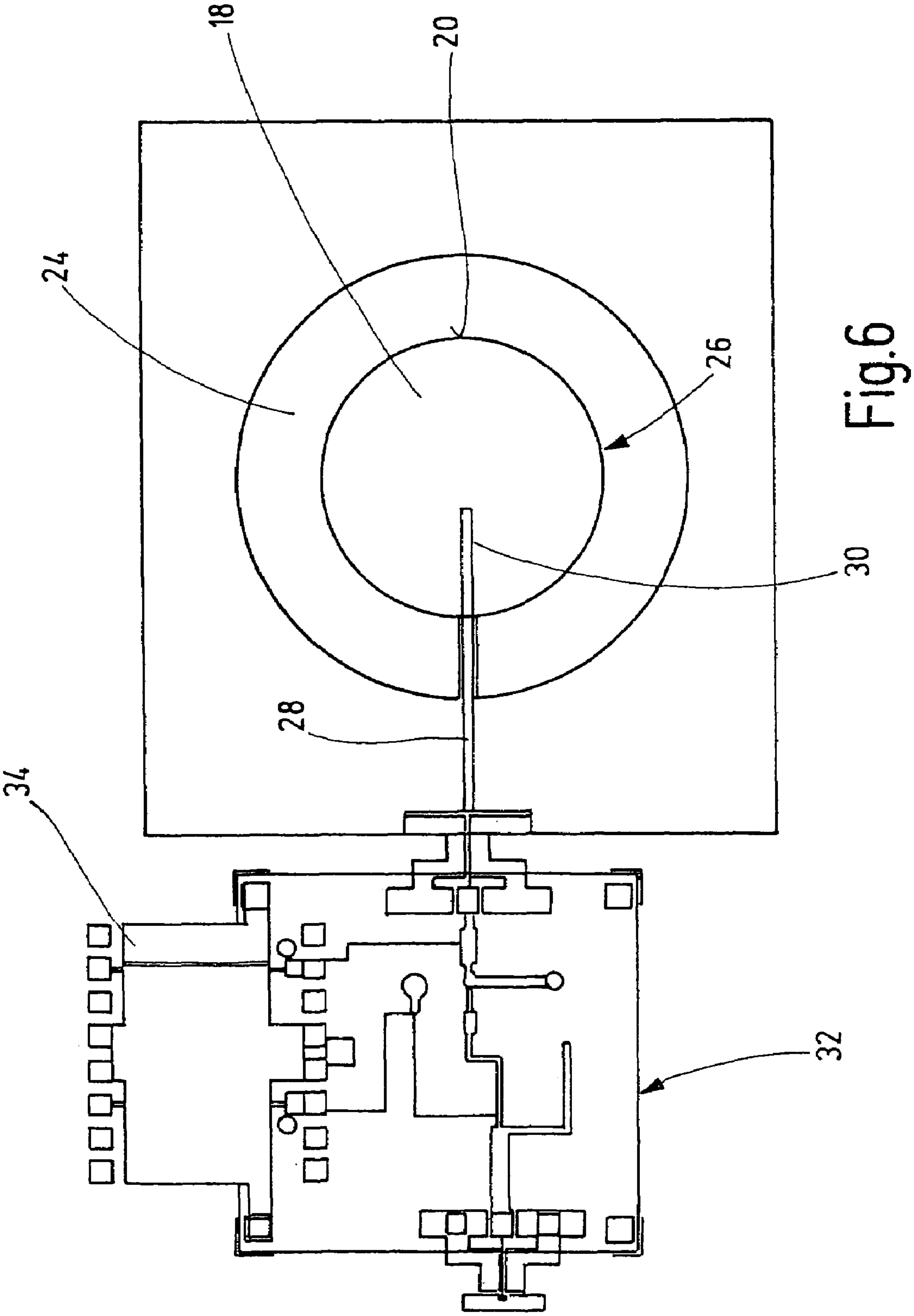
FIG. 6 is the coupling of the micromechanical resonator to the surrounding active microline circuit.

FIG. 6 schematically depicts how a coupling of the resonator 26 to an active microstrip line circuit 32 with flip chip-mounted gallium arsenic MMIC 34 via the microwave guide 28 in the slit 30 of the coupling disk 24 can take place. The design is easy to reproduce, making it suitable for mass production.

What is claimed is:

1. A micromechanical resonator (26) having a bondable resonance body (26), wherein the resonator (26) is composed successively of (a) a first layer (16) of silicon for coupling the resonator (26) in terms of a circuit, (b) an insulating layer (14) of silicon dioxide, (c) a cylinder (18) being formed in a base layer (12), and (d) a metal layer (20) completely surrounding the cylinder (18), wherein the base layer (12) has a specific resistance in the range of >500 Ωcm.

2. The micromechanical resonator according to claim 1, wherein the metal layer (20) is composed of aluminum.

3. The micromechanical resonator according to claim 1, wherein the metal layer (20) is covered by another metal layer.

4. The micromechanical resonator according to claim 1, wherein the cylinder (18) has a resonator height of 550 to 900 μm.

5. The micromechanical resonator according to claim 1, wherein the cylinder (18) has a resonance frequency of 1 to 500 GHz.

6. The micromechanical resonator according to claim 1, wherein the resonator (26) is capable of being operated in the $TM_{010}$ mode.

7. The micromechanical resonator according to claim 1, wherein the base layer (12) is 400 to 900 μm thick.

8. The micromechanical resonator according to claim 1, wherein the insulating layer (14) is 100 to 500 nm thick.

9. The micromechanical resonator according to claim 1, wherein the first layer (16) serves as carrier substrate for a microstrip line circuit.

10. The micromechanical resonator according to claim 1, wherein a region of the first layer (16) above the cylinder (18) is covered with a coupling disk (24).

11. The micromechanical resonator according to claim 10, wherein the coupling disk (24) is sized to prevent microwave energy from escaping at its edge; in particular, a diameter of the coupling disk (24) is greater than a diameter of the cylinder (18).

12. The micromechanical resonator according to claim 10, wherein the coupling disk (24) comprises a recess (30) for accommodating a microwave guide.

13. The micromechanical resonator according to claim 1, wherein the metal layer (20) is covered by a nickel layer (22).

14. The micromechanical resonator according to claim 1, wherein the cylinder (15) has a resonator height of 700 to 750 μm.

15. The micromechanical resonator according to claim 1, wherein the cylinder (18) has a resonance frequency of 20 to 150 GHz.

16. The micromechanical resonator according to claim 1, wherein the base layer (12) is 600 to 700 μm thick.

17. The micromechanical resonator according to claim 1, wherein the insulating layer (14) is 250 to 350 nm, thick.

* * * * *